(12) United States Patent
Kakuta et al.

(10) Patent No.: US 6,313,706 B1
(45) Date of Patent: *Nov. 6, 2001

(54) SEMICONDUCTOR CIRCUIT WITH A STABILIZED GAIN SLOPE

(75) Inventors: Yuji Kakuta; Yoshiaki Fukasawa; Yuichi Taguchi, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,620

(22) Filed: Nov. 19, 1998

(30) Foreign Application Priority Data

Nov. 27, 1997  (JP) .................................................... 9-326442

(51) Int. Cl.⁷ ...................................................... H03F 3/191

(52) U.S. Cl. ............................................. 330/302; 330/294

(58) Field of Search ..................................... 330/107, 109, 330/294, 302

(56) References Cited

U.S. PATENT DOCUMENTS 3,701,034 * 10/1972 Bruene .............................. 330/109 X
5,072,200 * 12/1991 Ranky .............................. 330/109 X

FOREIGN PATENT DOCUMENTS

| | | |
|---|---|---|
| 63-33913 | 2/1988 | (JP) . |
| 1-264404 | 10/1989 | (JP) . |
| 2-105708 | 4/1990 | (JP) . |
| 3-52407 | 3/1991 | (JP) . |
| 5-191176 | 7/1993 | (JP) . |
| 6-104668 | 4/1994 | (JP) . |
| 6-245174 | 9/1994 | (JP) . |
| 9-18246 | 1/1997 | (JP) . |

* cited by examiner

*Primary Examiner*—Steven J. Mottola
(74) *Attorney, Agent, or Firm*—Sughrue, Mion, Zinn, Macpeak & Seas, PLLC

(57) ABSTRACT

Realizing a stabilized gain slope without increasing circuit scale or entailing extra time or care for correcting impedance. A resonant circuit that is made up of a capacitor and an inductor is provided in an output stage outside a feedback loop for realizing peaking at a particular frequency and for realizing a gain slope having a desired slope of, for example, 1 dB or more.

2 Claims, 7 Drawing Sheets

SEMICONDUCTOR CIRCUIT WITH A STABILIZED GAIN SLOPE

BACKGROUND OF THE INVENTION

1. Field of the Invention

The present invention relates to a semiconductor circuit, and particularly to a semiconductor circuit used in CATV (CAble TeleVision) hybrid IC (HIC).

2. Description of the Related Art

In HIC (hybrid IC) broadband amplifiers for CATV, a plurality of stages of amplifiers are connected in series via coaxial cable, and a desired gain slope must be established across the entire employed frequency band to correct for characteristic lost in the coaxial cable. Gain slope is such that gain increases with higher frequencies within the bandwidth.

Realization of desired gain slope in the frequency bands employed has become more difficult in recent years as the frequency bandwidths that are used have extended to higher frequencies.

FIG. 1 and FIG. 2 are circuit diagrams showing the configuration of circuits for realizing a desired gain slope used in the prior art as disclosed in Japanese Utility Model laid-open application No. 85810/83.

In the circuits shown in FIG. 1 and FIG. 2, a parallel resonant circuit is formed by inductor L101, which is provided in a bias feedback circuit, and capacitor C102, which is provided between the base and emitter of transistor Tr 101. In addition, damping resistor R106 connected in a series with capacitor C102 between the base and emitter of transistor Tr101 is provided to control Q in the resonant circuit.

In a circuit configured according to the foregoing description, the resonance frequency is altered by changing the element constants of inductor L101 and capacitor C102, thereby regulating the peaking frequency.

FIG. 3 and FIG. 4 are circuit diagrams showing the configuration of circuits for realizing a desired gain slope used in the prior art as disclosed in Japanese Patent Laid-open No. 264404/89.

In the circuit shown in FIG. 3, a serial resonant circuit is formed by capacitor C112 and inductor L111 in an interstage circuit provided between two amplifier circuits, and in the circuit shown in FIG. 4, FET(Field Effect Transistor) Tr113 is provided such that inductor L111 is connected in parallel between the source and drain, and a parallel resonant circuit is formed by inductor L111 and the capacitance between the source and drain of FET Tr113.

In the circuits configured according to the foregoing description, alteration of resonance frequency is realized by changing the gate bias to vary the capacitance between the source and drain of FET Tr113, thereby regulating peaking frequency.

However, the above-described circuits of the prior art have the following drawbacks:

(1) In the circuits shown in FIG. 1 and FIG. 2, resonance frequency is altered by changing the element constants of inductor L101 and capacitor C102 to regulate the peaking frequency, but the impedance on the input side and output side change according to the amount of peaking because inductor L101 and capacitor C102 are provided in the feedback circuit.

The resulting circuit therefore has the three factors of input and output impedance and gain slope, and design and adjustment consequently require considerable time and trouble.

(2) In the circuits shown in FIG. 3 and FIG. 4, the resonance frequency is changed and the peaking frequency adjusted by changing the gate bias to change capacitance between the source and drain of the FET, and these circuits therefore require a variable bias to allow change of the gate bias. These circuits also require the additional provision of a FET. As a result both the scale and cost of the circuit increases.

In the circuit shown in FIG. 3, moreover, capacitor C111 and inductor L111 between active elements must also be changed to alter the resonance frequency, and mismatching between elements having gain tends to cause problems in characteristics such as oscillation and instability.

SUMMARY OF THE INVENTION

The object of the present invention is to provide a semiconductor circuit that can realize a stable gain slope without increasing the circuit scale or necessitating extra time for correcting impedance.

In this invention, a resonant circuit is provided outside a feedback loop for effecting peaking at a particular frequency and for realizing a gain slope having a desired inclination, for example, an inclination of 1 dB or more. As a result, the oscillation operation need not be considered when designing the circuit.

In addition, in a case in which a resonant circuit is provided in the output stage of a feedback loop, change in impedance occurs only on the output side and change in impedance does not occur on the input side. A circuit can therefore be designed and adjusted while considering only two factors and without taking the input side into consideration, thereby facilitating adjustment.

Finally, the invention does not entail enlargement of circuit scale because additional active elements are not necessary.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

FIRST EMBODIMENT

Figure 5:
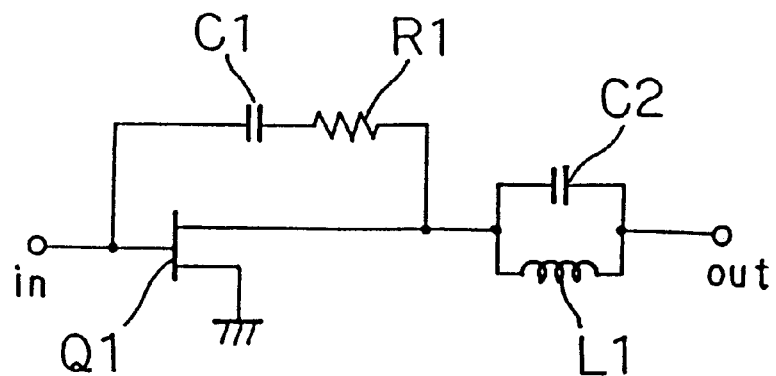
FIG. 5 is a circuit diagram showing a semiconductor circuit according to the first embodiment of the present invention.

FIG. 5 is a circuit diagram showing a semiconductor circuit according to the first embodiment of the present invention. This circuit is only the alternating-current portion of the semiconductor circuit of this invention.

As shown in FIG. 5, this embodiment is made up of FET Q1 having its gate terminal connected to the input terminal and its source terminal connected to ground; resistor R1 and capacitor C1 connected in a series between the drain terminal and gate terminal of FET Q1; and capacitor C2 and inductor L1 connected in parallel between the output terminal and the drain terminal of FET Q1; wherein a feedback loop is formed by FET Q1, resistor R1, and capacitor C1. This feedback loop is provided for maintaining the band and impedance.

In a semiconductor circuit configured according to the foregoing description, peaking is brought about by the resonance brought about by inductor L1 and capacitor C2, and as a result, the resonance frequency can be changed and a desired slope, for example, of 1 dB or more, can be conferred upon gain by altering the element constants of this inductor L1 and capacitor C2.

In this embodiment, although impedance changes because the constants of elements constituting the circuit are altered, only impedance on the output side undergoes change because the circuit that generates resonance is provided outside the feedback loop, and impedance on the input side does not change.

Figure 1:
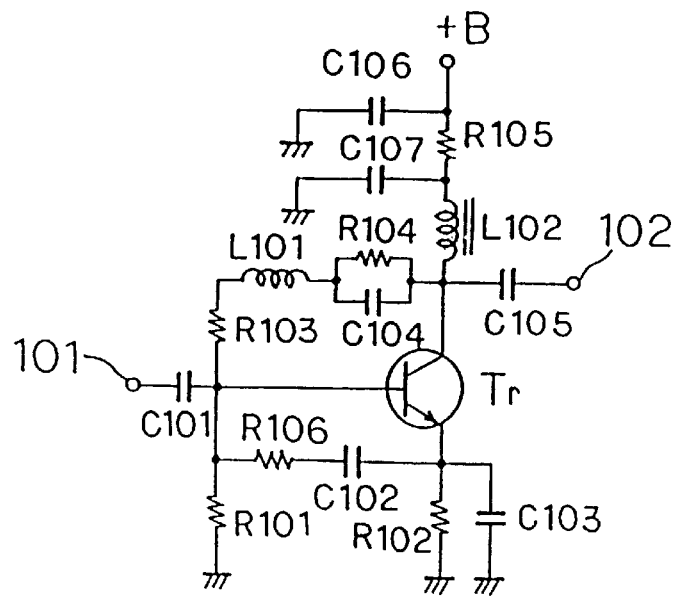
FIG. 1 is a circuit diagram showing the configuration of a circuit for realizing a desired gain slope used in the prior art as disclosed in Japanese Utility Model laid-open No. 85810/83.
Figure 2:
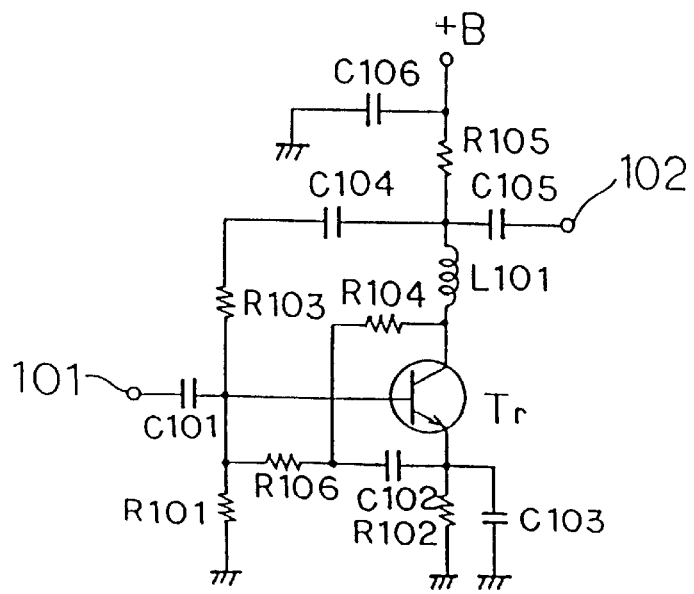
FIG. 2 is a circuit diagram showing the configuration of a circuit for realizing a desired gain slope used in the prior art as disclosed in Japanese Utility Model laid-open No. 85810/83.

As a result, this embodiment can reduce the time and trouble required in designing and adjusting as compared with the circuits shown in FIG. 1 and FIG. 2 in which impedance changes on both the input side and output side.

Figure 3:
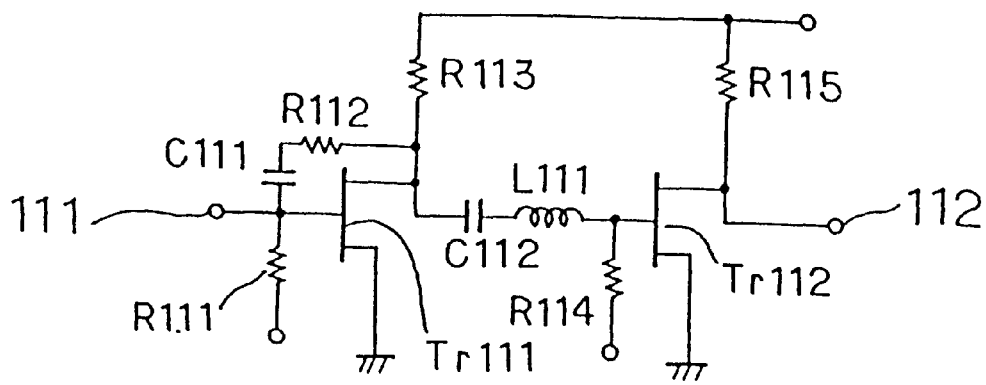
FIG. 3 is a circuit diagram showing the configuration of a circuit for realizing a desired gain slope used in the prior art as disclosed in Japanese Patent Laid-open No. 264404/89.
Figure 4:
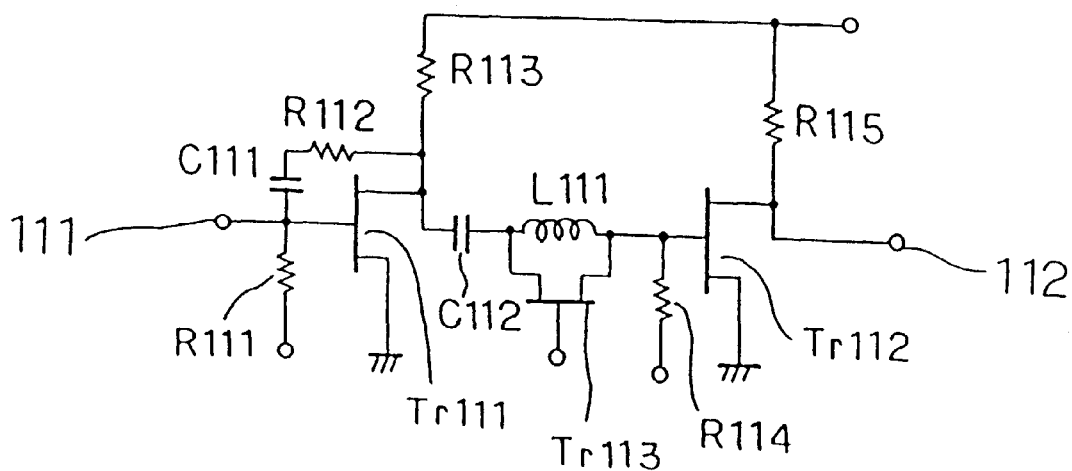
FIG. 4 is a circuit diagram showing the configuration of a circuit for realizing a desired gain slope used in the prior art as disclosed in Japanese Patent Laid-open No. 264404/89.

This invention can also dispense with the need for variable bias for altering the gate bias of the FET shown in FIG. 3 and FIG. 4, because the resonance frequency is modified by simply altering the constants of elements. As a result, a slope can be imposed on gain without increasing circuit scale. In addition, oscillation resulting from mismatching of impedance does not occur because the alteration of element constants does not take place in interstage elements.

Although inductor L1 and capacitor C2 are connected in parallel in this embodiment, peaking can be similarly effected if these elements are connected in a series.

In the semiconductor circuit configured as described hereinabove, the resonant circuit composed of inductor L1 and capacitor C2 can also be constituted only by chip inductance that includes a capacitance component.

Figure 6:
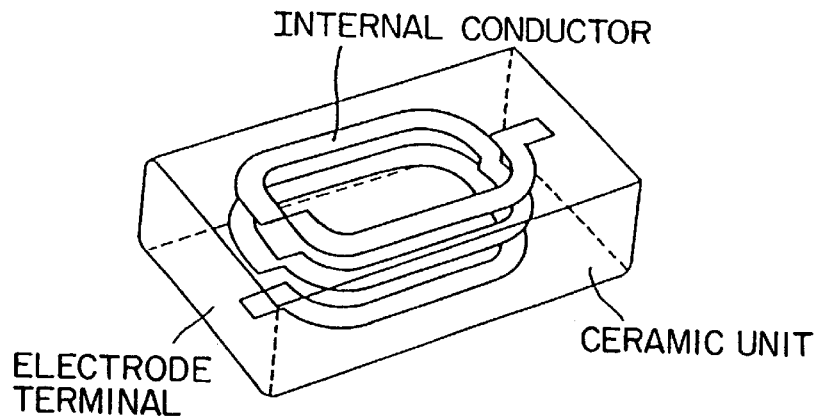
FIG. 6 shows one example of the configuration of chip inductance that includes a capacitance component.
Figure 7:
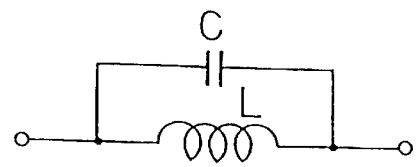
FIG. 7 is an equivalent circuit diagram of the chip inductance shown in FIG. 6.

FIG. 6 shows an example of the configuration of chip inductance including a capacitance component, and FIG. 7 is an equivalent circuit diagram of the chip inductance shown in FIG. 6.

As shown in FIG. 6, the chip inductance of this example includes internal conductors that constitute the L component that are linked in a number of layers in a helical spring form in a ceramic unit with the portions that constitute the C component interposed between the conductors. A resonant circuit including an L component and C component is thus formed as shown in FIG. 7.

Figure 8:
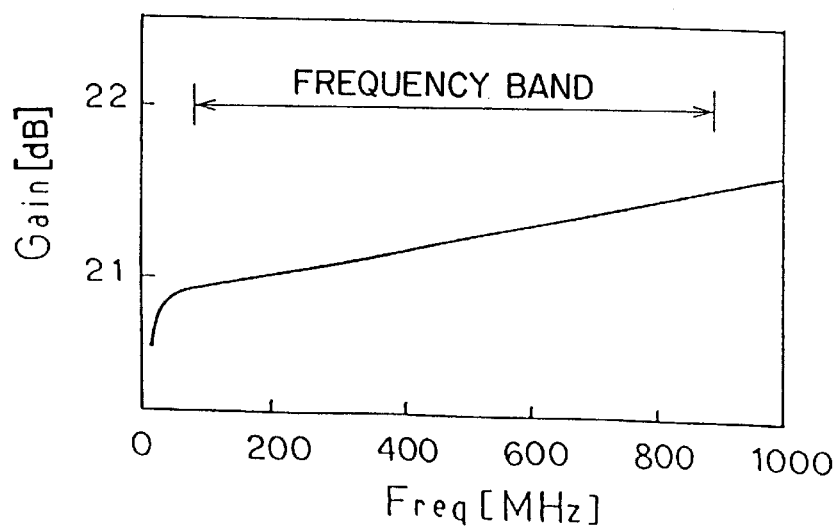
FIG. 8 shows the gain characteristic with respect to frequency for a case in which a resonant circuit is not applied in the circuit shown in FIG. 5.
Figure 9:
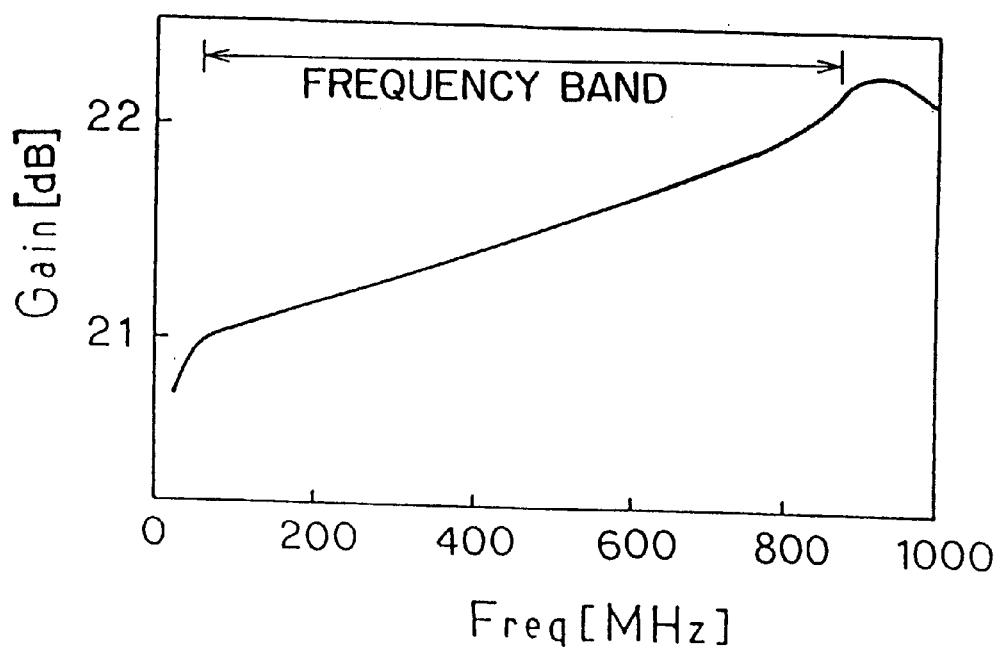
FIG. 9 shows the gain characteristic with respect to frequency in the circuit shown in FIG. 5.

FIG. 8 shows the gain characteristic with respect to frequency for a case in which a resonant circuit is not applied in the circuit shown in FIG. 5, and FIG. 9 shows the gain characteristic with response to frequency in the circuit shown in FIG. 5.

As shown in FIG. 9, the circuit shown in FIG. 5 realizes a gain slope having a desired inclination of, for example, 1 dB or more in a desired frequency band.

SECOND EMBODIMENT

Figure 10:
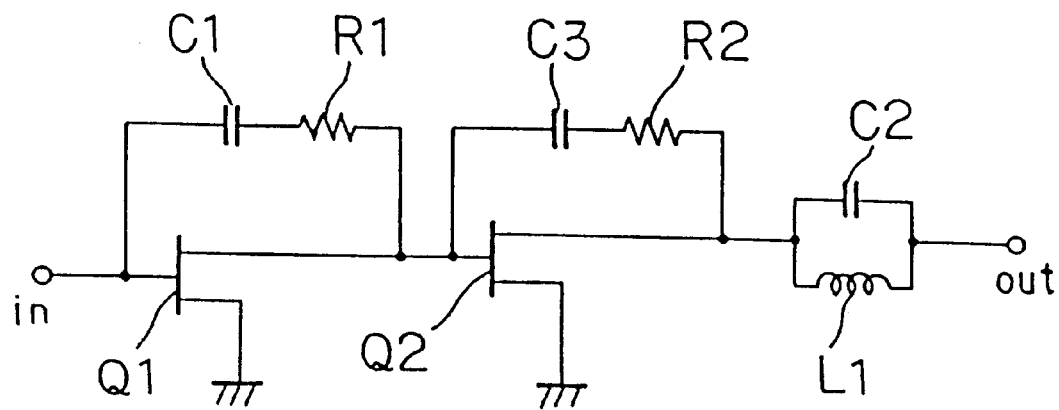
FIG. 10 is a circuit diagram showing a semiconductor circuit according to the second embodiment of the present invention.

FIG. 10 is a circuit diagram showing a semiconductor circuit according to the second embodiment of the present invention. This circuit is only the alternating-current portion of the semiconductor circuit of this invention.

As shown in FIG. 10, this embodiment is made up of: FET Q1 having its gate terminal connected to the input terminal and its source terminal connected to ground; resistor R1 and capacitor C1 connected in a series between the drain terminal and gate terminal of FET Q1; FET Q2 having its gate terminal connected to the drain terminal of FET Q1 and its source terminal connected to ground; resistor R2 and capacitor C3 connected in a series between the drain terminal and gate terminal of FET Q2; and capacitor C2 and inductor L1 connected in parallel between the output terminal and the drain terminal of FET Q2; wherein a first feedback loop is formed by FET Q1, resistor R1, and capacitor C1; and a second feedback loop is formed by FET Q2, resistor R2, and capacitor C3.

In a semiconductor circuit configured as described hereinabove, the circuit generating resonance is provided outside the feedback loops, and as a result, only the output side impedance changes and the input side impedance does not change, as in the circuit described in the first embodiment. This construction allows a reduction of the time and trouble necessary for designing and adjusting the circuit.

THIRD EMBODIMENT

Although two feedback loops are formed in the circuit shown in FIG. 10, a similar effect can be obtained with only one of the feedback loops.

Figure 11:
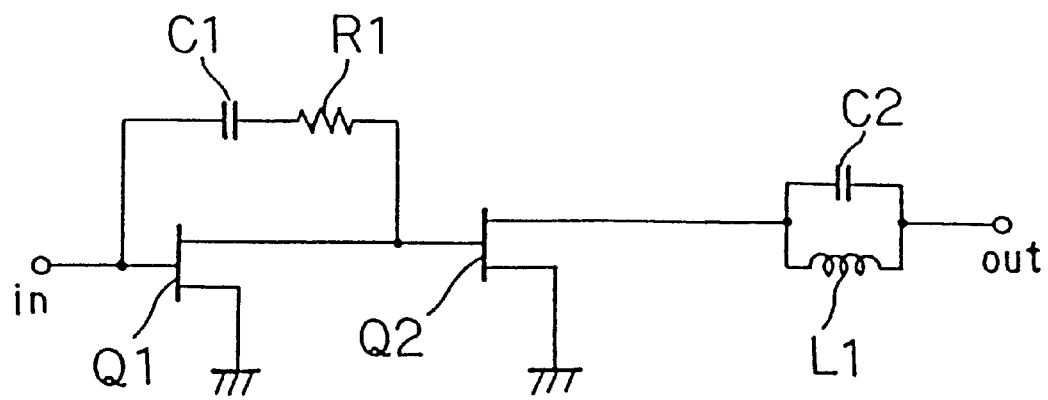
FIG. 11 is a circuit diagram showing a semiconductor circuit according to the third embodiment of the present invention.

FIG. 11 is a circuit diagram showing a semiconductor circuit according to the third embodiment of the present invention. This circuit is only the alternating-current portion of the semiconductor circuit of this invention.

As shown in FIG. 11, the resonant circuit constituted by inductor L1 and capacitor C2 in this embodiment is provided outside the feedback loop constituted by FET Q1, resistor R1, and capacitor C1. As a result, only the output side impedance changes and the input side impedance undergoes no change, whereby the time and trouble required for design and adjustment can be reduced.

Although the feedback loop is constituted by FET Q1, resistor R1, and capacitor C1 in this embodiment, the same effect can be obtained if the feedback is formed using FET Q2 if the resonant circuit is provided outside the feedback loop.

FOURTH EMBODIMENT

The same effect can be obtained in the circuit shown in FIG. 10 even in the case of a feedback loop that effects feedback from the drain terminal of FET Q2 to the gate terminal of FET Q1.

Figure 12:
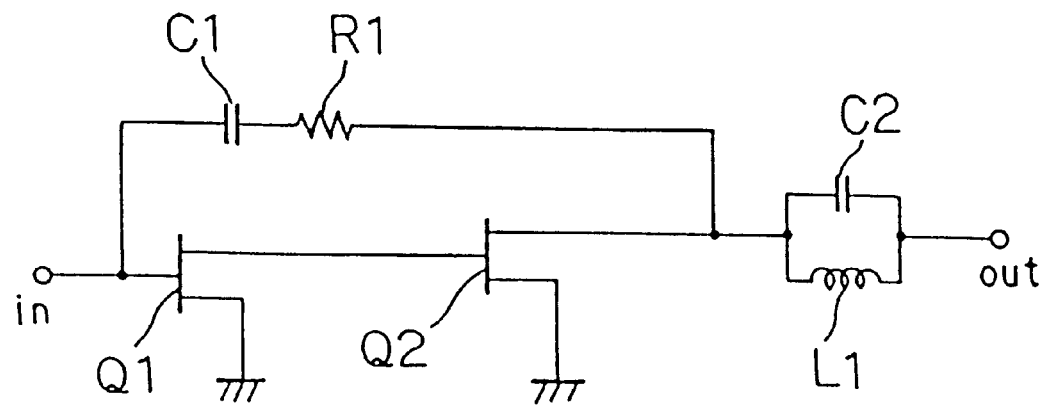
FIG. 12 is a circuit diagram showing a semiconductor circuit according to the fourth embodiment of the present invention.

FIG. 12 is a circuit diagram showing a semiconductor circuit according to the fourth embodiment of the present invention.

In the embodiment shown in FIG. 12, only the output side impedance changes and the input side impedance undergoes no change because the resonant circuit constituted by inductor L1 and capacitor C2 is provided outside the feedback loop constituted by FET Q1 and Q2, resistor R1, and capacitor C1. This embodiment therefore reduces the time and trouble required for design and adjustment.

Although a circuit has been described in this embodiment in which FETs were connected in two stages, the invention is not limited to two FETs, and the same effect can be obtained in a case in which a plurality of FETs are connected in multiple stages as long as the resonant circuit is provided outside the feedback loop.

FIFTH EMBODIMENT

Figure 13:
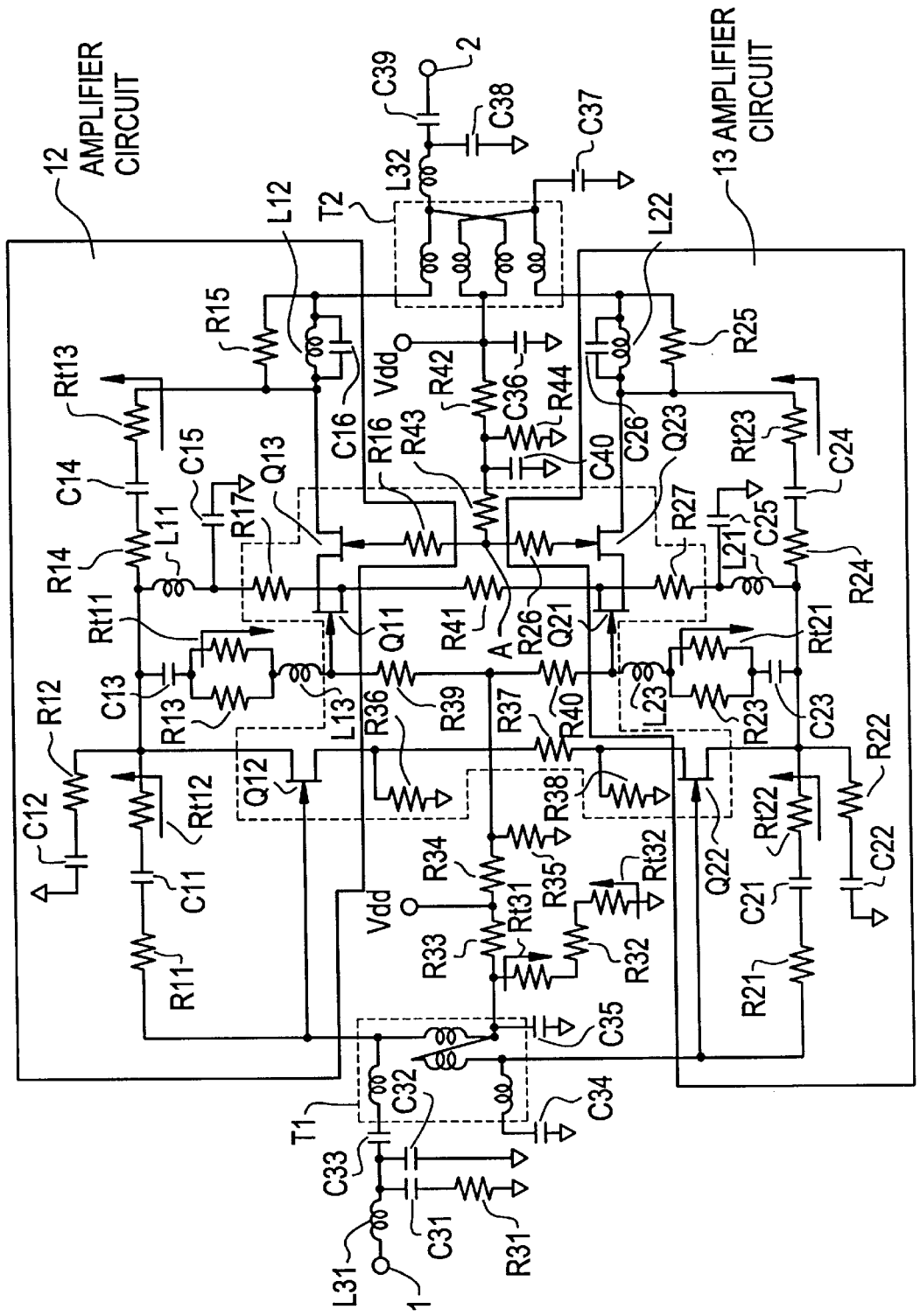
FIG. 13 is a circuit diagram showing a semiconductor circuit according to the fifth embodiment of the present invention.

FIG. 13 is a circuit diagram showing the semiconductor circuit according to the fifth embodiment of the present invention.

As shown in FIG. 13, inputted signals in this embodiment are distributed into two differing signals, the two distributed signals are each amplified by amplifier circuit 12 and 13, and the signals amplified by amplifiers 12 and 13 are then synthesized and outputted.

Transformer T1 grounded by way of capacitors C34 and C35 is provided as a distributing means that distributes signals inputted by way of input terminal 1 into two signals of different phase, and transformer T2 that is grounded by way of capacitor C37 is provided as a synthesizing means for synthesizing the two signals amplified by amplifiers 12 and 13.

Amplifier circuit 12 is made up of: FETs Q11–Q13 connected in multiple stages; thermistor Rt11 and resistor R13 connected together in parallel and provided as the gate resistance of FET Q11, the second FET; inductor L13 provided between the gate terminal of FET Q11 and a connection point between thermistor Rt11 and resistor R13; resistor R11, capacitor C11, and thermistor Rt12 connected in a series between the gate terminal, i.e., the input of amplifier circuit 12, and the drain terminal of FET Q12; resistor R12 and capacitor C12 connected in a series between the drain terminal of FET Q12 and a prescribed potential; capacitor C13 connected between the drain terminal of FET Q12 and the other connection point between thermistor Rt11 and resistor R13; inductor L11 and resistor R17 connected in a series between the drain terminal of FET Q12 and the source terminal of FET Q11; capacitor C15 connected between the connection point between inductor L11 and resistor R17 and the prescribed potential; resistor R14, capacitor C14, and thermistor Rt13 connected in a series between the drain terminal of FET Q12 and the drain terminal of FET Q13; resistor R16 connected to the gate terminal of FET Q13; and resistor R15, inductor L12, and capacitor C16 provided connected in parallel between the drain terminal of FET Q13 and the output terminal of amplifier circuit 12; the drain terminal of FET Q11 and the source terminal of FET Q13 being connected.

Amplifier circuit 13 is made up of: FETs Q21–Q23 connected in multiple stages; thermistor Rt21 and resistor R23 connected together in parallel and provided as the gate resistance of FET Q21, the second FET; inductor L23 provided between the gate terminal of FET Q21 and a connection point between thermistor Rt21 and resistor R23; resistor R21, capacitor C21, and thermistor Rt22 connected in a series between the gate terminal, i.e., the input of amplifier circuit 13, and the drain terminal of FET Q22; resistor R22 and capacitor C22 connected in a series between the drain terminal of FET Q22 and a prescribed potential; capacitor C23 connected between the drain terminal of FET Q22 and the other connection point between thermistor Rt21 and resistor R23; inductor L21 and resistor R27 connected in a series between the drain terminal of FET Q22 and the source terminal of FET Q21; capacitor C25 connected between the connection point between inductor L21 and resistor R27 and a prescribed potential; resistor R24, capacitor C24, and thermistor Rt23 connected in a series between the drain terminal of FET Q22 and the drain terminal of FET Q23; resistor R26 connected to the gate terminal of FET Q23; and resistor R25, inductor L22, and capacitor C26 provided connected in parallel between the drain terminal of FET Q23 and the output terminal of amplifier circuit 13; the drain terminal of FET Q21 and the source terminal of FET Q23 being connected.

The gate terminal of FET Q13 and the gate terminal of FET Q23 are connected by way of resistors R16 and R26.

On the input side of transformer T1 are provided: capacitor C33 and inductor L31 connected in a series between transformer T1 and input terminal 1, capacitor C31 and resistor R31 connected in a series between the connection point between capacitor 33 and inductor L31 and the prescribed potential, and capacitor C32 connected between the connection point between capacitor 33 and inductor L31 and the prescribed potential; and on the output side of transformer T2 are provided: inductor L32 and capacitor C39 connected in a series between transformer T2 and output terminal 2, and capacitor C38 connected between the connection point between inductor L32 and capacitor C39 and the prescribed potential.

In addition, between amplifier circuit 12 and amplifier circuit 13 are provided: resistor R41 connected between the source terminal of FET Q11 and the source terminal of FET Q21, resistors R39 and R40 connected in a series between the gate terminal of FET Q11 and the gate terminal of FET Q21, resistors R33 and R34 connected in a series between the connection point between resistor R39 and resistor R40 and transformer T1, resistor R32 and thermistors Rt31 and Rt32 connected in a series between the connection point between resistor R33 and transformer T1 and the prescribed potential, resistor R35 connected between the prescribed potential and the connection point between resistor R34 and the connection point between resistors R39 and R40, resistor R37 connected between the source terminal of FET Q12 and the source terminal of FET Q22, resistor R36 connected between the source terminal of FET Q12 and the prescribed potential, resistor R38 connected between the source terminal of FET Q22 and the prescribed potential, resistors R42 and R43 connected between transformer T2 and the connection point between resistor R16 and resistor R26, resistor R44 and capacitor C40 connected in parallel between the prescribed potential and the connection point between resistor R42 and R43, and capacitor C36 connected between the prescribed potential and the connection point between resistor R42 and transformer T2; and power supply voltage Vdd is impressed to the connection point between resistor R33 and resistor R34 as well as to the connection point between resistor R42 and transformer T2.

Thermistors Rt11, Rt21, and Rt31 are thermally sensitive resistance elements in which resistance changes with a negative temperature characteristic according to the ambient temperature, and thermistors Rt12, Rt13, Rt22, Rt23, and Rt32 are thermally sensitive resistance elements in which resistance changes with a positive temperature characteristic according to the ambient temperature.

In a semiconductor circuit configured according to the foregoing description, peaking is brought about by resonance generated by inductor L12 and capacitor C16 (similarly, by resonance generated by inductor L22 and capacitor C26). As a result, the resonance frequency can be changed by changing the element constants of this inductor L12 and capacitor C16 (similarly, the element constants of inductor L22 and capacitor C26), and moreover, Q can be controlled by resistors R15 and R25 for Q damping, and gain can therefore be set to a slope of 1 dB or more.

In this embodiment, impedance changes because the constants of elements that constitute the circuit are changed, but only the output side impedance changes and the input side impedance undergoes no change. Because the resonant circuit constituted by inductor L12 and capacitor C16 is provided outside the feedback loop that uses FETs Q11–Q13 in amplifier circuit 12 and the resonant circuit constituted by inductor L22 and capacitor C26 is provided outside the feedback loop that uses FETs Q21–Q23 in amplifier circuit 13.

The embodiment therefore enables a reduction of time and trouble in design and adjustment.

In addition, modification of the resonant frequency by altering the element constants obviates the need for variable bias for altering the gate bias of the FET, whereby a slope can be set to gain without increasing the scale of the circuit. Further, oscillation due to mismatching of impedance does not occur because alteration of the element constants does not take place in interstage elements.

In this embodiment, thermistors Rt11 and Rt21 having a negative temperature characteristic are provided as the gate resistance of FETs Q11 and Q21, respectively.

In amplifier circuit 12, fluctuations in gain characteristic with respect to ambient temperature in the gain slope that is generated in the resonant circuit constituted by inductor L12 and capacitor C16 are thus canceled out by fluctuations in the value of Q with respect to ambient temperature in the circuit constituted by capacitor C13, thermistor Rt11, and inductor L13, and the inclination of the gain slope outputted from amplifier circuit 12 is therefore uniform despite variations in the ambient temperature.

Similarly, in amplifier circuit 13, fluctuations in gain characteristic with respect to ambient temperature in the gain slope that is generated in the resonant circuit constituted by inductor L22 and capacitor C26 are canceled out by fluctuations in the value of Q with respect to ambient temperature in the circuit constituted by capacitor C23, thermistor Rt21, and inductor L23, and the inclination of the gain slope outputted from amplifier circuit 13 is therefore uniform despite variations in the ambient temperature.

In this embodiment, thermistors Rt31 and Rt32 are connected in a series between prescribed potential and the connection point between resistor R33 and transformer T1.

As a result, the current in the vicinity of a prescribed temperature is therefore at a minimum, and the circuit current increases as the ambient temperature falls from the prescribed temperature and also increases as the ambient temperature rises from the prescribed temperature, thereby enabling prevention of deterioration of distortion characteristic due to change in temperature.

In this embodiment, moreover, resistor R43 having a resistance of 10–100Ω is provided between resistor R42 and the connection point between resistor R16 and resistor R26, and capacitor C40 is provided between the prescribed potential and the connection point between resistor R42 and resistor R43, the circuit constants of these components being set according to termination conditions.

Thus, in the case in which fluctuation in potential occurs at point A in the figure, the fluctuation in potential (wave) is absorbed by resistor R43, and a standing wave is not generated, thereby enabling prevention of deterioration by even distortion (principally CSO) that is caused by the standing wave.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit comprising:

an amplifier circuit that amplifies and outputs an alternating current signal;

a feedback loop that feeds back from an output side to an input side of said amplifier circuit; and, a resonant circuit outside said feedback loop, and outside any other feedback loop in said semiconductor circuit that feeds back into said feedback loop, said resonant circuit comprising a conductor arranged as a coil having a number of turns and having an inductance, with portions having a capacitance component interposed between turns of said conductor, thereby providing said resonant circuit with an inductance portion and a parallel capacitance portion.

2. A semiconductor circuit according to claim 1 wherein said resonant circuit is connected to an output stage of said feedback loop.

* * * * *